United States Patent
Kurt

(10) Patent No.: US 7,420,653 B2
(45) Date of Patent: Sep. 2, 2008

(54) LITHOGRAPHIC PROJECTION APPARATUS, MIRROR, METHOD OF SUPPLYING A PROTECTIVE CAP LAYER, DEVICE MANUFACTURING METHOD AND DEVICE MANUFACTURED ACCORDINGLY

(75) Inventor: Ralph Kurt, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 102 days.

(21) Appl. No.: 10/953,510

(22) Filed: Sep. 30, 2004

(65) Prior Publication Data
US 2005/0118835 A1 Jun. 2, 2005

(30) Foreign Application Priority Data
Oct. 2, 2003 (EP) ................... 03078114

(51) Int. Cl.
*G03B 27/54* (2006.01)
*G03B 27/42* (2006.01)
*G02B 5/08* (2006.01)

(52) U.S. Cl. ................... 355/67; 355/53; 359/360; 359/838

(58) Field of Classification Search ................... 355/53, 355/67, 77; 359/360, 361, 584, 585, 838; 430/5
See application file for complete search history.

(56) References Cited
U.S. PATENT DOCUMENTS

| | | | |
|---|---|---|---|
| 4,837,123 A * | 6/1989 | Kato et al. ................... 430/269 |
| 5,000,528 A | 3/1991 | Kawakatsu | |
| 5,196,283 A * | 3/1993 | Ikeda et al. ................... 430/5 |
| 5,433,988 A * | 7/1995 | Fukuda et al. ................ 428/141 |
| 5,773,177 A * | 6/1998 | Ikeda et al. ................... 430/5 |
| 6,078,425 A | 6/2000 | Wolfe et al. | |
| 6,641,959 B2 * | 11/2003 | Yan ................... 430/5 |
| 6,724,462 B1 | 4/2004 | Singh et al. | |
| 6,998,200 B2 * | 2/2006 | Lee ................... 430/5 |
| 2002/0012797 A1 | 1/2002 | Bijkerk et al. | |
| 2002/0109954 A1 | 8/2002 | Tsuruta | |
| 2003/0027053 A1 * | 2/2003 | Yan ................... 430/5 |

FOREIGN PATENT DOCUMENTS

| | | | |
|---|---|---|---|
| EP | 1 065 568 A2 * | 1/2001 | |
| JP | 3-105912 | 5/1991 | |

OTHER PUBLICATIONS

Oestreich et al., "Multilayer reflectance during exposure to EUV radiation," *Proceedings of SPIE* 4146:64-71 (2000).

* cited by examiner

*Primary Examiner*—Alan A Mathews
(74) *Attorney, Agent, or Firm*—Pillsbury Winthrop Shaw Pittman, LLP

(57) ABSTRACT

A lithographic projection apparatus includes a radiation system configured to provide a beam of radiation; a support configured to support a patterning device, the patterning device configured to pattern the beam according to the desired pattern; a substrate table configured to hold a substrate; and a projection system configured to project the patterned beam onto a target portion of the substrate. A component of the lithographic projection apparatus is at least partially provided with a cap layer that includes aluminum nitride.

14 Claims, 2 Drawing Sheets

LITHOGRAPHIC PROJECTION APPARATUS, MIRROR, METHOD OF SUPPLYING A PROTECTIVE CAP LAYER, DEVICE MANUFACTURING METHOD AND DEVICE MANUFACTURED ACCORDINGLY

This application claims priority to European Patent Application 03078114.0, filed Oct. 2, 2003, the entire contents of which are incorporated herein by reference.

BACKGROUND OF THE INVENTION

1. Field of the Invention

The present invention relates to a lithographic projection apparatus, a mirror, a method of supplying a protective cap layer, a device manufacturing method and a device manufactured thereby.

2. Description of the Related Art

The term "patterning device" as here employed should be broadly interpreted as referring to a device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission in the case of a transmissive mask, or reflection in the case of a reflective mask, of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such a device is a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-adressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-adressable mirrors. The required matrix addressing can be performed using suitable electronics. In both of the situations described above, the patterning device can include one or more programmable mirror arrays. More information on mirror arrays can be gleaned, for example, from U.S. Pat. Nos. 5,296,891 and 5,523,193, and PCT Patent Application Publications WO 98/38597 and WO 98/33096, which are incorporated herein by reference. In the case of a programmable mirror array, the support may be embodied as a frame or table, for example, which may be fixed or movable as required.

Another example of a patterning device is a programmable LCD array. An example of such a construction is shown in U.S. Pat. No. 5,229,872, which is incorporated herein by reference. As above, the support may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as set forth above.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. including one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper or step-and-repeat apparatus. In an alternative apparatus, commonly referred to as a step-and-scan apparatus, each target portion is irradiated by progressively scanning the mask pattern under the projection beam in a given reference direction, the "scanning" direction, while synchronously scanning the substrate table parallel or anti-parallel to this direction. In general, the projection system will have a magnification factor M (generally <1), and the speed V at which the substrate table is scanned will be a factor M times that at which the mask table is scanned. More information with regard to lithographic devices as here described can be found, for example, in U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from "Microchip Fabrication: A Practical Guide to Semiconductor Processing," Third Edition, by Peter van Zant, McGraw Hill Publishing Co., 1997, ISBN 0-07-067250-4, incorporated herein by reference.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel, or preparatory processes may be carried out on one or more tables while one or more other tables are being used for exposures. Dual stage lithographic apparatus are described, for example, in U.S. Pat. Nos. 5,969,441 and 6,262,796, both incorporated herein by reference.

In the present invention, the projection system will generally consist of an array of mirrors, and the mask will be reflective. The radiation in this case is preferably electromagnetic radiation in the extreme ultraviolet (EUV) range. Typically, the radiation has a wavelength below 50 nm, but preferably below 15 nm, for instance 13.7 or 11 nm. The source of EUV radiation is typically a plasma source, for example a laser-produced plasma or a discharge source.

Optical elements for use in the EUV spectral region are especially sensitive to physical and chemical damage which can significantly reduce their reflectivity and optical quality. Reflectivities at these wavelengths are already low compared to reflectors at longer wavelengths, which is a particular problem since a typical EUV lithographic system may have several mirrors. For instance, a EUV lithographic system may have nine mirrors: two in the illumination optics, six in the imaging optics, plus the reflecting mask. It is therefore evident that even a small decrease of 1-2% in the peak reflectivity of a single mirror will cause a significant light throughput reduction in the optical system.

Reflection losses may be caused by different mechanisms. One of the main causes for reflection losses is a degradation of the reflective surface of the mirror due to oxidation. A further problem is that some sources of EUV radiation, e.g. plasma based sources, are dirty in that they also emit significant quantities of fast ions and other particles which can damage optical elements in the illumination system. Local defects of the reflective surface of the mirror may cause projection errors, resulting in defective chips. Also, carbon present in the low pressure environment surrounding the mirror will precipitate on the reflective surface of the mirror, reducing the reflectivity of the mirror.

In order to protect the mirror against these damaging mechanisms, it is known to provide the reflective surface of the mirror with a protective layer. For example, European Patent Application Publication 1 065 568 A2 describes the use of a cap layer. Many different materials are proposed, such as diamond-like carbon (C), boron nitride (BN), boron carbide ($B_4C$), silicon nitride ($Si_3N_4$), silicon carbide (SiC), B, Pd, Ru, Rh, Au, $MgF_2$, LiF, $C_2F_4$ and TiN and compounds and alloys thereof.

It will be understood that a thick protective layer gives a good protection against etching by fast ions and other degradation. Also, a certain minimum thickness, depending on the material, is required to obtain a layer that is free of pinholes. However, the protective layer should be as thin as possible, in order to reduce the reflectivity of the mirror as little as possible.

Capped multilayers have been tested that were made from Ru or C, having a typical thickness of approximately 1-3 nm. However, these already showed strong signs of irreversible degradation after approximately 50 hours irradiation under realistic tool conditions. By controlled balancing, or mitigation, of carbon growth and oxidation the life time of an EUV mirror could reach up to 200-2000 hours. Since a desired duration of protection is approximately more than 15,000 hours, for example, 30,000 hours, this is still much too short. Also, there is a high risk of introducing local non-homogeneous degradation, either by local oxidation or by local carbon growth. Such local degradation of the mirror causes local errors in the projected pattern.

A further disadvantage of known cap layers is that the cap layer mixes with the material of the mirror. This is called intermixing and is caused by radiation induced diffusion. Therefore, according to the prior art, an anti-diffusion layer is provided between the cap layer and the reflective surface of the mirror.

It is also known that other components of the lithographic projection apparatus are damaged by, for example, oxidation and/or carbon growth. These other components, such as cables, walls or metal or PTFE constructions with a large area, also need to be protected against damaging mechanisms, in order to increase their lifespan. A further disadvantage of such components is that such components relatively gas out a lot of molecules. Molecules that gas out such components contaminate the system and reduce the vacuum quality.

SUMMARY OF THE INVENTION

It is an aspect of the present invention to protect components of a lithographic projection apparatus. It is also an aspect of the present invention to provide protection for the reflective surface of a mirror that protects the mirror for a long period.

According to an embodiment of the present invention, a lithographic projection apparatus includes a radiation system configured to provide a beam of radiation; a support configured to support a patterning device, the patterning device configured to pattern the projection beam according to the desired pattern; a substrate table configured to hold a substrate; and a projection system configured to project the patterned beam onto a target portion of the substrate, wherein a component of the lithographic projection apparatus is at least partially provided with a cap layer that includes aluminum nitride.

Examples of such components include a multilayer mirror, grazing incidence mirror, mask, detector, cable or a construction, such as a wafer stage, shielding or surrounding walls.

According to another embodiment of the present invention, aluminum nitride compounds containing 20-50 atomic % N are included, as it is difficult to obtain AlN in pure state.

The use of AlN as a cap layer provides protection against oxidation. Experiments have shown that a AlN layer can withstand irradiation for a very long time. For example, a 30 nm thick AlN layer can withstand irradiation under equivalent exposure tool conditions for approximately 15,000 hours in a vacuum of approximately $10^{-7}$ mbar $H_2O$ without aging. It should be appreciated that the amount of Al and N is not necessarily exactly the same. In case of 50 atomic % N, the amount of Al will normally be lower than 50 atomic % Al, due to impurities of oxygen and/or other materials. The case of 50 atomic % Al and 50 atomic % N is a theoretical case and difficult to obtain in actual practice. A good practical value is, for example, 40 atomic % N, 50 atomic % Al and 10 atomic % O.

AlN is an almost oxide free material, i.e. its surface will withstand further air exposures without oxidation, especially if the nitrogen concentration in the cap layer is high, preferably greater than 35%. This allows a user to handle the component provided with a AlN layer in air, without risking surface degradation. This is particularly useful in view of maintenance purposes.

The AlN layer also reduces the sticking probability of the surfaces provided with the AlN layer. In particular, the sticking probability to hydrocarbons is reduced. As a result of that, the amount of contamination sticking to the capped surface will be relatively low. In particular, the carbon growth under irradiation, direct by the projection beam or indirect by secondary electrons or EUV present in the entire chamber, on the protected surface is reduced. The carbon growth on a different but irradiated surface can also be reduced because out-gassing is reduced, lowering the hydrocarbon partial pressure. This results in reduced carbon deposition and therefore less carbon growth.

A further use of AlN as a protective layer is that an AlN layer will not mix with underlying materials, such as a multilayer mirror. Accordingly, no anti-diffusion layer is required.

According to yet another embodiment of the present invention, a part of the lithographic projection apparatus is arranged to be under vacuum conditions and the component is inside that part of the lithographic projection apparatus. A cap layer made of AlN will be useful in vacuum conditions where the surface of the components are exposed to, for example, EUV radiation. The term vacuum conditions refers to a pressure that is below atmospheric pressures. For EUV applications the pressure is usually below $10^{-3}$ Pa.

According to still another embodiment of the present invention, the lithographic projection apparatus includes a radiation system, the radiation system includes an EUV source to produce the beam of radiation with a wavelength below 20 nm. As the present invention may be applied in vacuum conditions, the present invention may also be used in EUV applications, as EUV radiation require vacuum conditions.

According to a further embodiment of the present invention, the component of the lithographic projection apparatus is a multilayer mirror, a grazing incidence mirror, a mask, a hose, a detector, a cable, a construction, such as a wafer stage, a shielding, and/or a surrounding wall. Hoses can be used for gas and/or water inlets and/or outlets. All these components are exposed to degradation of their surfaces. Also, the cap layer will significantly reduce the out-gassing of molecules. Cabling in the projection optics compartment will be about 1-2 $m^3$ with a corresponding large surface that can out-gas. Moreover, that surface will be loaded again during maintenance with large amounts of water and hydrocarbon molecules. Therefore, pumping takes a long time and the vacuum is degraded. An AlN containing coating mitigates that significantly.

According to another embodiment of the present invention, the cap layer has a thickness of approximately 30-300 nm. Such a cap layer provides protection against oxidation and out-gassing. Such cap layers may be formed on components such as: a grazing incidence mirror, a hose, a cable, a construction, such as a wafer stage, shielding and/or surrounding walls.

According to still another embodiment of the present invention, the component is an optical element, and the cap layer is provided on the optical element and has a thickness of less than 5 nm. In particular, the optical element is a mirror that suffers from degradation. A thicker cap layer will absorb too much of the incoming radiation. The mirror could be a multilayer mirror, but could also be a reflective mask. Therefore, a protective AlN layer having a thickness of approximately 2-4 nm may be used on the reflective surface of a mirror. A thicker AlN layer would reduce the reflectivity of the mirror too much. Examples of such optical elements include a multilayer mirror, a mask, and/or a detector.

According to a further aspect of the present invention, a mirror for use as a projection device in a lithographic projection apparatus is provided with a protective cap layer, including aluminum nitride, of less than 5 nm. There exist two types of EUV mirrors: normal incidence mirrors, or multilayer mirrors, being mainly in the projection system, the mask and in the illuminator; and grazing incidence mirrors placed in the collector and between the compartments. Normal incidence/multilayer mirrors are restricted to the thin cap layer of less than 5 nm. The grazing incidence mirrors may have a cap layer of 3 nm-300 nm.

According to a still further aspect of the present invention, a method of supplying a protective cap layer including aluminum nitride to a component for use in a lithographic projection apparatus includes sputtering of aluminum nitride to the component. Sputtering is an easy and cost effective way of supplying a cap layer to a component. The sputtering may be done in a reactive nitrogen containing environment, in order to increase the nitrogen content in the resulting film. Vacuum evaporation is also possible.

According to an embodiment of the present invention, a method of supplying a cap layer including aluminum nitride to a component further includes applying a plasma treatment in a nitrogen or nitrogen containing environment. Applying a plasma surface treatment in a nitrogen or nitrogen containing environment after deposition of the cap layer and before use of the coated component will improve its stability, i.e. protection against oxidation under irradiation will be improved. Further on, the passivation of the coated component will improve, resulting in low sticking of carbon.

According to a still further aspect of the present invention, a device manufacturing method for use with a lithographic projection apparatus includes projecting a patterned beam of radiation onto a target portion of a layer of radiation-sensitive material at least partially covering a substrate, wherein a component of the lithographic projection apparatus is at least partially provided with a cap layer comprising aluminum nitride.

According to a further aspect of the present invention, a device is made with a lithographic projection apparatus or by a method according to the present invention.

Although specific reference may be made in this text to the use of the apparatus according to the present invention in the manufacture of ICs, it should be appreciated that such an apparatus has many other possible applications. For example, it may be employed in the manufacture of integrated optical systems, guidance and detection patterns for magnetic domain memories, liquid-crystal display panels, thin-film magnetic heads, etc. It should be appreciated that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm), as well as particle beams, such as ion beams or electron beams.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
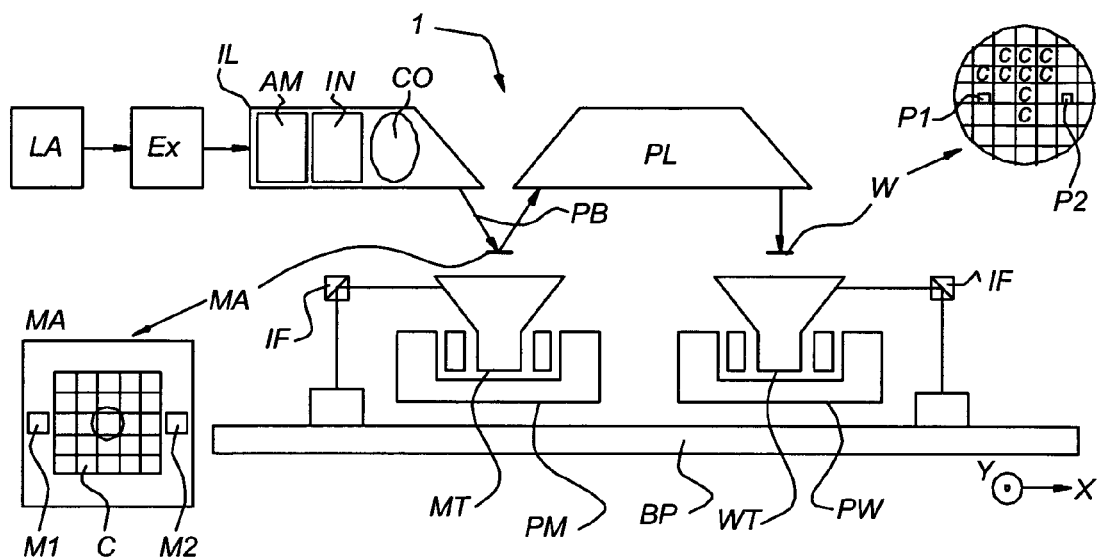
FIG. 1 depicts a lithographic projection apparatus according to an embodiment of the present invention.

Referring to FIG. 1, a lithographic projection apparatus 1 according to an embodiment of the present invention includes a base plate BP. A radiation system Ex, IL is configured to supply a beam of radiation PB (e.g. EUV radiation). In this embodiment, the radiation system also includes a radiation source LA. A first object table (mask table) MT is provided with a mask holder to hold a mask MA (e.g. a reticle) and is connected to a first positioning device PM that accurately positions the mask with respect to a projection system ("lens") PL. A second object table (substrate table) WT is provided with a substrate holder to hold a substrate W (e.g. a resist-coated silicon wafer) and is connected to a second positioning device PW that accurately positions the substrate with respect to the projection system PL. The projection system PL (e.g. mirrors) images an irradiated portion of the mask MA onto a target portion C (e.g. including one or more dies) of the substrate W.

As here depicted, the apparatus is of a reflective type. However, it may also be of a transmissive type. Alternatively, the apparatus may employ another kind of patterning device, such as a programmable mirror array of a type as referred to above.

The source LA (e.g. EUV source) produces radiation. The radiation is fed into an illumination system (illuminator) IL, either directly or after having traversed a conditioning device, such as a beam expander Ex. The illuminator IL may include an adjusting device AM to set the outer and/or inner radial extent (commonly referred to as σ-outer and σ-inner, respectively) of the intensity distribution in the beam. In addition, it will generally include various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus, as is often the case when the source LA is a mercury lamp for example, but that it may also be remote from the lithographic projection apparatus, the radiation beam which it produces being led into the apparatus, for example with the aid of suitable directing mirrors. This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the projection system PL, which focuses the beam PB onto a target portion C of the substrate W. With the aid of the second positioning device PW and an interferometric measuring device IF, the substrate table WT can be moved accurately to position different target portions C in the path of the beam PB. Similarly, the first positioning device PM and an interferometric measuring device IF can be used to accurately position the mask MA with respect to the path of the beam PB, for example after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper, as opposed to a step-and-scan apparatus, the mask table MT may just be connected to a short stroke actuator, or may be fixed. Mask MA and substrate W may be aligned using mask alignment marks M1, M2 and substrate alignment marks P1, P2.

The depicted apparatus can be used in at least two different modes:

1. In step mode, the mask table MT is kept essentially stationary, and an entire mask image is projected at once (i.e. a single "flash") onto a target portion C. The substrate table WT is then shifted in the X and/or Y directions so that a different target portion C can be irradiated by the beam PB; and 2. In scan mode, essentially the same scenario applies, except that a given target portion C is not exposed in a single "flash". Instead, the mask table MT is movable in a given direction, the "scan direction", e.g. the y direction, with a speed v, so that the projection beam PB is caused to scan over a mask image. Concurrently, the substrate table WT is simultaneously moved in the same or opposite direction at a speed $V=Mv$, in which M is the magnification of the projection system PL (typically, $M=¼$ or $⅕$). In this manner, a relatively large target portion C can be exposed, without having to compromise on resolution.

Figure 2:
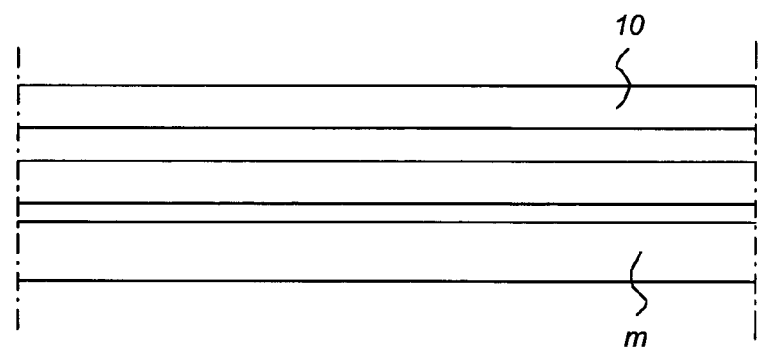
FIG. 2 schematically depicts a multilayer mirror with a cap layer according to the present invention.

FIG. 2 shows a multilayer mirror M provided with a cap layer 10 according to the present invention. The cap layer 10 is a thin film, including an aluminum-nitride compound, for example, 20-50% N. The cap layer may have a thickness of less than 5 nm, for example 2-4 nm.

The multilayer mirror M may be used as a projection device in a lithographic projection apparatus as described above, including a lithographic projection apparatus using EUV radiation.

The cap layer 10 may be made using known techniques. The cap layer 10 may be deposited on the multilayer mirror M by sputtering or evaporation. Sputtering in a reactive $N_2$ environment is also possible, followed by a nitrogen plasma treatment.

Applying an plasma surface treatment in a nitrogen or nitrogen containing environment after deposition of the cap layer 10 and before use of the coated component will improve its stability, i.e. protection against oxidation under irradiation will be improved. Further on, the passivation of the coated component will improve, i.e. low sticking.

This same techniques can be used to deposit the cap layer 10 on other components, such as cables, walls as will be discussed below.

Figure 3:
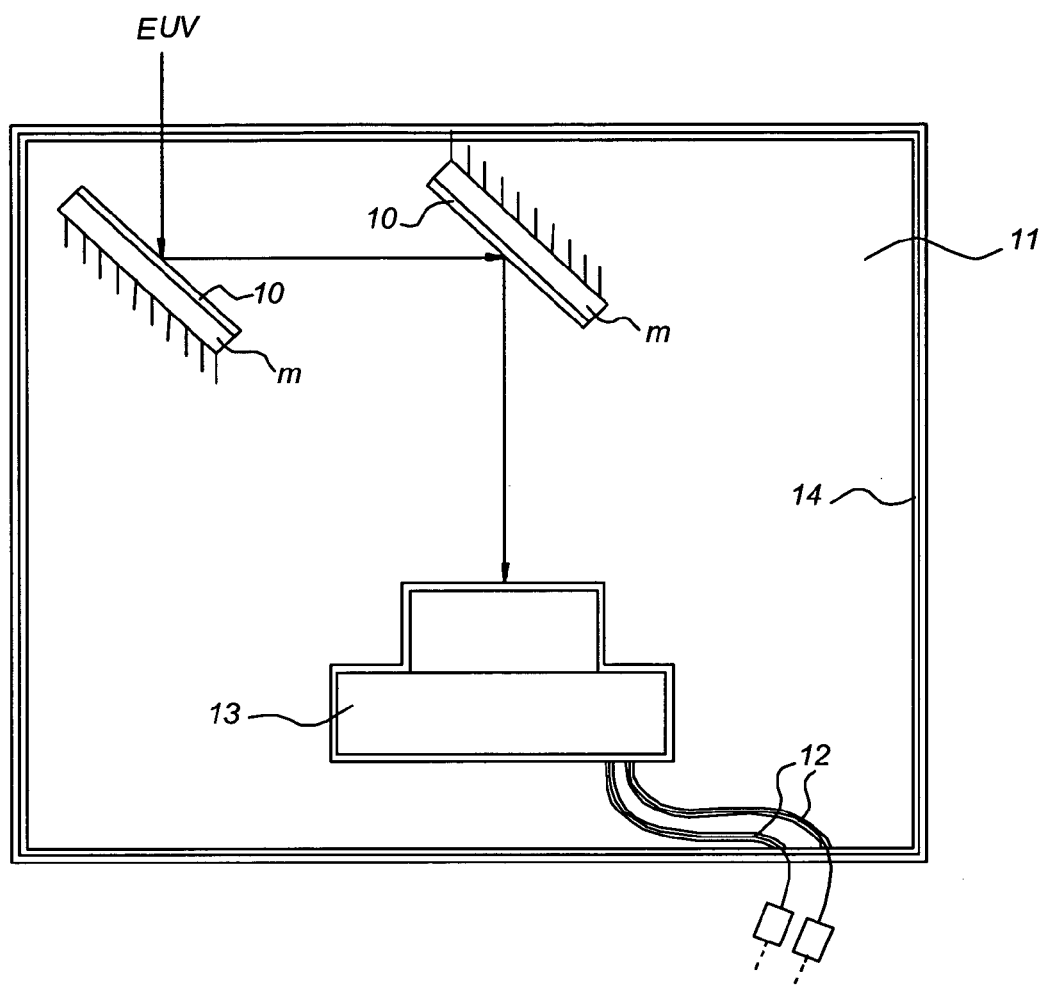
FIG. 3 schematically depicts a part of a lithographic projection apparatus according to the present invention.

FIG. 3 shows a further embodiment of the present invention. The figure depicts a part of the lithographic projection apparatus, for example a chamber 11, that, in use, is under vacuum conditions ($10^{-4}$-$10^{-5}$ Pa). The chamber 11 may include all kinds of components, including multilayer mirrors M, grazing incidence mirrors, a mask MA (not shown in FIG. 3), hoses, detectors, cables 12, constructions 13, such as a wafer stage WS, and/or the surrounding walls 14. Hoses can be used as an inlet and/or outlet of water and/or gasses. The constructions can be metal constructions, but can also be made of other materials, such as PTFE. A detector may be a light detector. According to FIG. 3, in which a couple of these components are shown, these components are also provided with a cap layer 10 including a substantial amount of aluminium nitride (AlN).

These AlN containing cap layers 10 not only protect the components against the damaging chemical and physical influences as already discussed above, but also reduce outgassing of molecules. This helps to maintain the purity of the system and to establish and maintain the vacuum.

The cap layers 10 that are provided on some components of the lithographic projection apparatus 1, except the optical components, such as the multilayer mirror M, the mask MA or detectors, may have a thickness of approximately 30 nm or thicker. Such a cap layer 10 will withstand air exposure, maintenance, cleaning cycles and heating cycles, and will not create a charge effect. The optical components, such as the multilayer mirror M, the mask MA and detectors, are provided with a thinner cap layer 10, for example less than 5 nm.

As already stated above, the amount of Al and N is not necessarily exactly the same. In case of 50 atomic % N, the amount of Al will normally be lower than 50 atomic % Al, due to impurities of oxygen and/or other materials. The case of 50 atomic % Al and 50 atomic % N is a theoretical case and difficult to obtain in actual practice. A practical value is, for example, 40 atomic % N, 50 atomic % Al and 10 atomic % O, but other values may be used.

While specific embodiments of the present invention have been described above, it will be appreciated that the present invention may be practiced otherwise than as described. The description is not intended to limit the present invention.

What is claimed is:

1. A lithographic projection apparatus, comprising:
    a radiation system comprising an EUV source configured to produce a beam of radiation having a wavelength less than 20 nm;
    a support configured to support a patterning device, the patterning device configured to pattern the beam of radiation according to the desired pattern;
    a substrate table configured to hold a substrate; and
    a projection system configured to project the patterned beam of radiation onto a target portion of the substrate, wherein an optical component of the lithographic projection apparatus is at least partially provided with a cap layer comprising aluminum nitride and having a thickness of 5 nm or less.

2. A lithographic projection apparatus according to claim 1, wherein a part of the lithographic projection apparatus is arranged to be under vacuum conditions and the optical component is inside the part of the lithographic projection apparatus.

3. A lithographic projection apparatus according to claim 1, wherein the optical component is a multilayer mirror, or a grazing incidence mirror.

4. A lithographic projection apparatus according to claim 1, wherein the aluminum nitride comprises 20-50 atomic % N.

5. A lithographic projection apparatus according to claim 1, wherein the cap layer is substantially free of pinhole surface defects.

6. A mirror for use in a lithographic projection apparatus, wherein the mirror includes a cap layer comprising aluminum nitride and having a thickness of 5 nm or less, the mirror being configure d to interact with a beam of radiation having a wavelength less than 20 nm.

7. A mirror according to claim 6, wherein the mirror is a multilayer mirror or a grazing incidence mirror.

8. A mirror according to claim 6, wherein the aluminum nitride comprises 20-50 atomic % N.

9. A mirror according to claim 6, wherein the cap layer is substantially free of pinhole surface defects.

10. A device manufacturing method for use with a lithographic projection apparatus, the method comprising:
    projecting a patterned beam of EUV radiation having a wavelength less than 20 nm onto a target portion of a layer of radiation-sensitive material at least partially covering a substrate, wherein an optical component of the lithographic projection apparatus is at least partially provided with a cap layer comprising aluminum nitride and having a thickness of 5 nm or less.

11. A method according to claim 10, wherein a part of the lithographic projection apparatus is arranged to be under vacuum conditions and the optical component is inside the part of the lithographic projection apparatus.

12. A method according to claim 10, wherein the optical component is a multilayer mirror, or a grazing incidence mirror.

13. A method according to claim 10, wherein the aluminum nitride comprises 20-50 atomic % N.

14. A method according to claim 10, wherein the cap layer is substantially free of pinhole surface defects.

* * * * *